United States Patent
Keller

(10) Patent No.: US 6,339,249 B1
(45) Date of Patent: Jan. 15, 2002

(54) SEMICONDUCTOR DIODE

(75) Inventor: Wolfgang Keller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/556,409

(22) Filed: Apr. 24, 2000

Related U.S. Application Data

(63) Continuation of application No. PCT/DE98/03018, filed on Oct. 14, 1998.

(51) Int. Cl.⁷ .................................................. H01L 29/93
(52) U.S. Cl. ........................................................ 257/480
(58) Field of Search ................................ 257/480, 483, 257/595, 599, 603; 438/379, 570

(56) References Cited

U.S. PATENT DOCUMENTS 4,208,669 A * 6/1980 Silber et al. ............. 257/480 X

FOREIGN PATENT DOCUMENTS

| DE | 2843960 A1 * | 4/1980 | ............. 257/480 X |
| DE | 4326846 A1 | 4/1994 | |

OTHER PUBLICATIONS

Published International Application No. 95/22842 (Beigel et al.), dated Aug. 24, 1995.
"The Breakdown Voltage of Negative Curvatured p+n Diodes Using a SOI Layer", Solid–State Electronics vol. 41, No. 5, pp. 787–788.

* cited by examiner

Primary Examiner—Olik Chaudhuri
Assistant Examiner—Vikki Hoa B. Trinh
(74) Attorney, Agent, or Firm—Herbert L. Lerner; Laurence A. Greenberg; Werner H. Stemer

(57) ABSTRACT

A semiconductor diode has two electrodes that form a cathode and an anode. The semiconductor diode is distinguished by the fact that at least one of the electrodes is curved, and that a surface area of the other electrode amounts to at most 20% of a product of a width of the other electrode and an inner edge length of the curved electrode. An electrical circuit constructed in such a way that it contains the semiconductor diode is also disclosed. The semiconductor diode contains two electrodes which form the cathode and anode, and is distinguished by the fact that at least one of the electrodes is curved, and that the surface area of the other electrode amounts to at most 20% of the product of the width of the other electrode and the inner edge length of the curved electrode.

11 Claims, 2 Drawing Sheets

SEMICONDUCTOR DIODE

This application is a continuation of PCT/DE98/03018 filed Oct. 14, 1998.

BACKGROUND OF THE INVENTION

Field of the Invention

The invention relates to a semiconductor diode having two electrodes that form a cathode and an anode.

The invention furthermore relates to an electrical circuit containing at least one semiconductor diode having two electrodes that form the cathode and the anode.

Diodes are asymmetrically constructed two-terminal networks whose resistance depends on a polarity and a magnitude of an applied voltage. Diodes are composed of two different materials, at least one material of which is a semiconductor. The different materials may be a semiconductor and a metal, or a semiconductor with differently doped regions. The differently doped regions generally contain p-doped and n-doped regions of the same semiconductor.

The following are known diodes: switching diodes, Schottky diodes, rectifier diodes, zener diodes, diacs, photodiodes, variable-capacitance diodes, PIN diodes, step recovery diodes, tunnel diodes, backward diodes.

It is known that a capacitance between the electrodes themselves and also between the individual electrodes and the substrate on which they are disposed is effected by two different mechanisms. The depletion layer capacitance and the diffusion capacitance are involved in this case.

The depletion layer capacitance arises from the fact that only a small saturation current flows in the case of a reverse-biased pn junction. A space charge is additionally present. Therefore, a reverse-biased diode acts like a lossy capacitor. As the reverse voltage increases, the depletion layer is widened. Therefore, the charge carrier depletion at the pn junction increases. It follows from this that the depletion layer capacitance $C_s$ decreases as the reverse voltage $U_r$ increases. When the reverse voltage $U_r=0$, the depletion layer capacitance $C_s$ has its maximum value. The following holds true for the maximum depletion layer capacitance $C_{smax}$:

$$C_{smax} = C_s(U_r = 0) = C_{so} = A \cdot \sqrt{\frac{\varepsilon_0 \cdot \varepsilon_r \cdot e}{2|U_d| \cdot \left[\frac{1}{n_A} + \frac{1}{n_D}\right]}}$$

In this case, A is a cross-sectional area of the depletion layer and $\varepsilon_r$ is a relative permittivity. For germanium it is $E_{r,Ge} \approx 16$, and for silicon it is $E_{r,Si} \approx 20$. The dependence of $C_s$ as a function of the reverse voltage $U_r$ is approximately given by the following relationship:

$$C_s = \frac{C_{so}}{\sqrt{1 + \frac{U_t}{U_D}}}$$

The diffusion capacitance corresponds to an internal inertia of the diode, which is principally caused by the inertia of minority charge carriers in bulk regions. If the diode is operated in a forward mode, then both majority and minority carrier currents flow in the bulk regions. Although the zones are intrinsically electrically neutral, the electrons or hole charges are fed in and conducted away by separate currents (field current or diffusion current). In the event of small, rapid changes to the forward voltage, this mechanism acts like a capacitance on account of its inertia. It is referred to as the diffusion capacitance $C_d$. The diffusion capacitance $C_d$ is proportional to the forward current $I_d$ and amounts to:

$$C_d = \frac{e \cdot A}{2 \cdot U_T \cdot |I_s|} \cdot (L_P + L_N) \cdot \frac{n_A \cdot n_D}{n_A + n_D} \cdot I_d$$

The diffusion capacitance plays a part in fast switching operations in which a diode in the on state is abruptly changed to the off state.

The stored charges in the bulk regions can then disappear only by recombination, and the voltage across the diode decreases approximately exponentially.

From these equations it follows directly that the entire capacitance is proportional to a cross-sectional area of the depletion layer. For this reason, the known semiconductor diodes have linear cathode regions in which the cross-sectional area of the depletion layer is minimal. In the case of the known diodes, the capacitance cannot be reduced to a greater extent. This becomes apparent in an interfering manner principally when the diodes are used with high-frequency signals.

Electrostatic discharge (ESD) protective diodes serve to protect an electronic component, for example a field-effect transistor, or an electrical circuit against irreversible damage caused by an electrostatic discharge, without impairing the function too much. In order to fulfill this protection function, the protective diode is connected between the component to be protected or the circuit to be protected and a grounding potential. Since the protective diode is reverse-biased, only a small reverse current flows through it. It is necessary that the diode have the smallest possible capacitance, in order that the high-frequency signal is attenuated as little as possible. The known diodes have the disadvantage that their capacitance is so high that the high-frequency signal is attenuated and distorted to an excessively great extent.

A diode with a circular electrode geometry is disclosed in the article titled "The Breakdown Voltage Of Negative Curvatured p+n Diodes Using a SOI Layer", Solid-State Electronics, Vol. 41, No. 5, pp. 787–788, 1997. The article relates to diodes with large electrode areas. In this case, the inner electrode has an area of as much as above $20,000 \, \mu m^2$. A circular electrode geometry was chosen in this case in order to obtain spatially independent breakdown voltages.

A diode with a circular electrode geometry is furthermore disclosed in PCT patent application WO 95/22842. Although this document likewise relates to curved electrodes, in this case the surface area of the curved outer electrode is significantly less than the area of the other, inner electrode. A surface area limit of $15 \, \mu m^2$ is exceeded to a considerable extent.

A diode with a circular electrode geometry is also disclosed in Published, Non-Prosecuted German Patent Application DE 43 26 846 A1. This document likewise relates to curved electrodes, but in this case the surface area of the curved outer electrode is significantly less than the area of the other, inner electrode. The surface area limit of $15 \, \mu m^2$ is likewise exceeded to a considerable extent.

SUMMARY OF THE INVENTION

It is accordingly an object of the invention to provide a semiconductor diode that overcomes the above-mentioned disadvantages of the prior art devices of this general type, in which the smallest possible capacitance is obtained between the electrodes and also between the individual electrodes and the substrate.

With the foregoing and other objects in view there is provided, in accordance with the invention, a semiconductor diode, containing two electrodes forming a cathode and an anode. At least one of the electrodes is a curved electrode having an inner edge length and another of the electrodes is an inner electrode having a width and a surface area of at most 20% of a product of the width of the inner electrode and the inner edge length of the curved electrode. The curved electrode has a surface area and the surface area of the inner electrode amounts to at most 20% of the surface area of the curved electrode, and the surface area of the inner electrode is at most 15 $\mu m^2$.

In the case of a semiconductor diode of the generic type, the object is achieved according to the invention by virtue of the fact that at least one of the electrodes is curved. The surface area of the other, inner electrode amounts to at most 20% of the product of the width of the inner electrode and the inner edge length of the curved, outer electrode. The surface area of the inner electrode amounts to at most 20% of the surface area of the curved electrode, and that the inner electrode has a surface area of at most 15 $\mu m^2$.

The invention thus provides for a semiconductor diode to be provided in which the inner electrode has a surface area of at most 15 $\mu m^2$ and, in accordance with the further features of the characterizing part, is chosen to be deliberately smaller than the outer, curved electrode.

The other, inner electrode may be the cathode or the anode. In this case, the curved outer electrode may be formed by the anode or the cathode.

A particularly expedient embodiment of the invention is distinguished by the fact that the surface area of the inner electrode amounts to at most 15% of the product of the width of the inner electrode and the inner edge length of the curved electrode.

It is particularly expedient for the electrical semiconductor diode to be configured in such a way that the surface area of the inner electrode amounts to at most 15% of the surface area of the curved electrode.

The invention furthermore provides for an electrical circuit of the generic type to be constructed in such a way that it contains a semiconductor diode, having two electrodes that form the cathode and anode. The semiconductor diode is distinguished by the fact that at least one of the electrodes is curved, and that the surface area of the inner electrode amounts to at most 20% of the product of the width of the inner electrode and the inner edge length of the curved electrode.

The semiconductor diode is expediently configured in such a way that the curved electrode is curved to such a great extent that the inner electrode is at least partially surrounded by the curved electrode. This embodiment of the semiconductor diode causes the capacitance to be reduced even more extensively.

In principle, the curved electrode can have any desired form. A particularly small capacitance between the curved electrode and the inner electrode can expediently be achieved by virtue of the fact that the curved electrode exhibits centrosymmetry.

A capacitance that is not only low but also can be determined exactly can be achieved by virtue of the fact that the curved electrode, at least in segments, has the form of an arc of a circle.

A particularly expedient embodiment of the semiconductor diode according to the invention is distinguished by the fact that the curved electrode has an annular form.

It is furthermore expedient that the inner electrode has a circular form.

A capacitance that is not only small but is also defined exactly can be achieved by virtue of the fact that the inner electrode has the form of a polygon. In this case, a polygon is understood to be a planar structure having at least three corners.

In order further to reduce the capacitance between the curved electrode and the inner electrode, it is expedient that the inner electrode is disposed at a midpoint of the curved electrode.

Other features which are considered as characteristic for the invention are set forth in the appended claims.

Although the invention is illustrated and described herein as embodied in a semiconductor diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
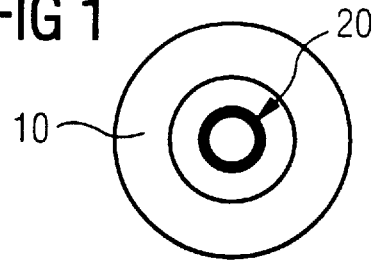
FIG. 1 is a diagrammatic, plan view of a first embodiment of a semiconductor diode according to the invention.

In all the figures of the drawing, sub-features and integral parts that correspond to one another bear the same reference symbol in each case. Referring now to the figures of the drawing in detail and first, particularly, to FIG. 1 thereof, there is shown two semiconductor diodes that are connected to one another in a parallel circuit on a structural plane that is not illustrated in the drawing.

In this case, a cathode 20 is located at a midpoint of a anode 10. The cathode 20 has a diameter $d_K = 2\ r_K$, which corresponds to a minimum structure width that is possible in the process for fabricating the semiconductor diode. An edge length of the cathode 20 amounts to $w_k = 2\pi r_K$. An area of the cathode 20 of an individual semiconductor diode amounts to: $A_{KK} = \pi r_K^2$.

In order to obtain a desired total edge length w, $N_k$ individual components must be connected in parallel. The following holds true for the number $N_k$ of required components: $N_k = w/w_k$.

This produces the following total cathode area:

$$A_{KG} = N_k \times A_{Kk} = w\pi r_K^2/(2\pi r_K) = w\ r_K/2$$

Figure 2:
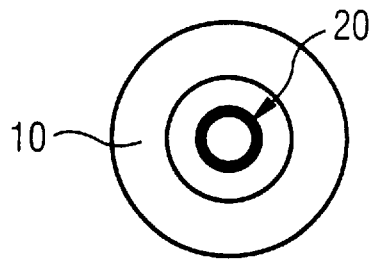
FIG. 2 is a plan view of a known semiconductor diode.
Figure 2:
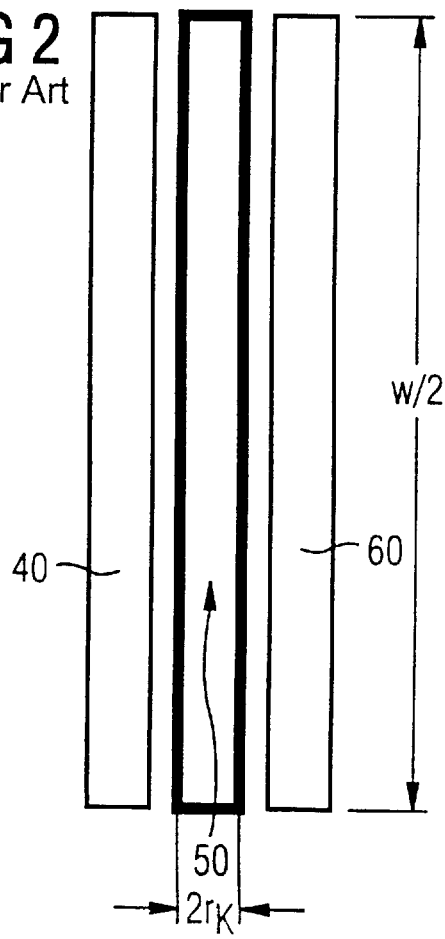

Given the same total edge length, the total cathode area $A_{KG}$ amounts to only half of the total cathode area $A_{K1}$ of the linear structure that is explained below with reference to FIG. 2.

Advantageous shielding from external electromagnetic fields is also obtained by virtue of the configuration illustrated. The configuration has the additional advantage that a capacitance that is particularly small and can be defined exactly is obtained at the same time.

The semiconductor diodes explained with reference to FIG. 2 belongs to the prior art. The diode here has a linear structure. The total edge length w is composed of two edge lengths w/2 of a cathode 50 which are directed at anodes 40 and 60. The total cathode area $A_{K1}$ amounts to:

$$A_{K1} = 2\, r_K \times w/2 = w \times r_D.$$

Figure 3:
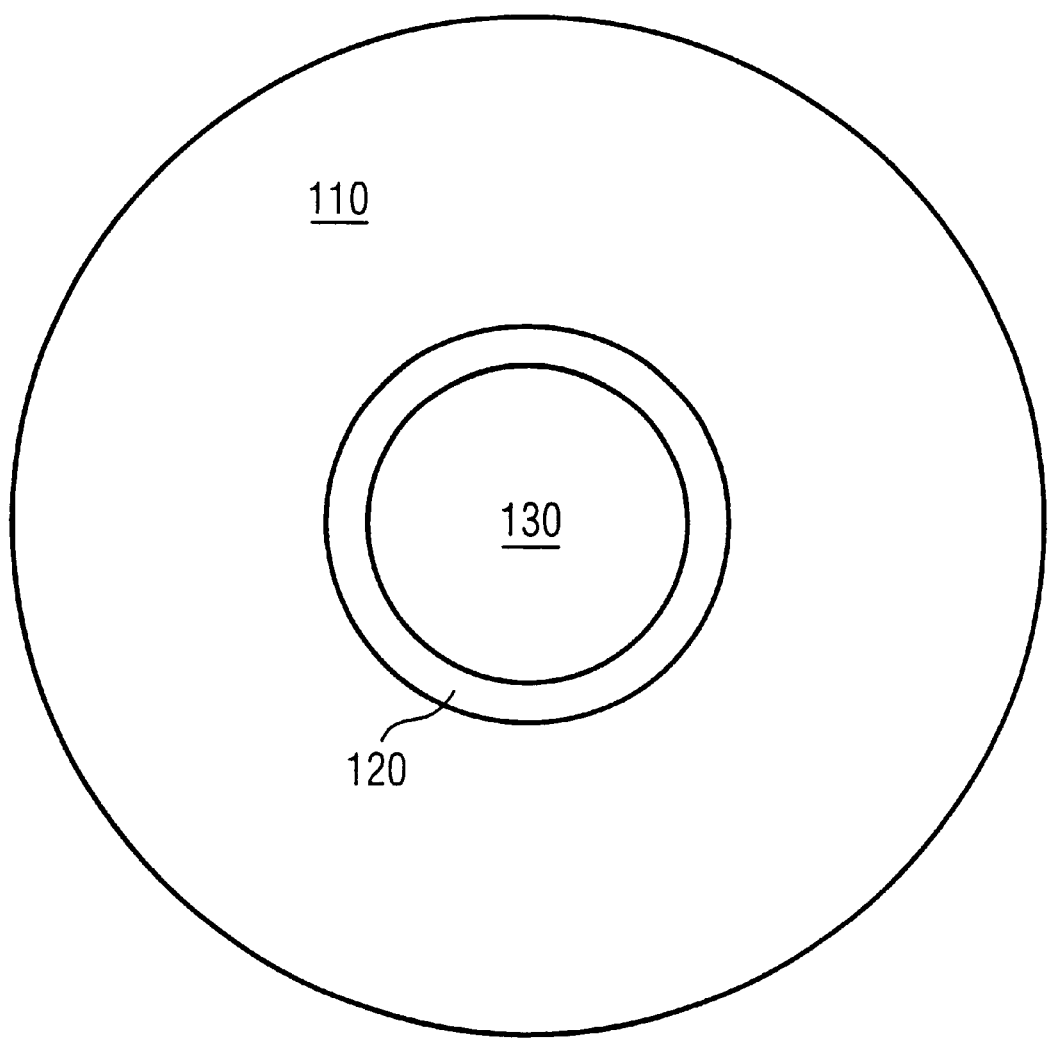
FIG. 3 is a plan view of a further embodiment of a semiconductor diode according to the invention.

The embodiment of a semiconductor diode according to the invention that is illustrated in FIG. 3 reveals that there is a narrow boundary region 120 located between a cathode 130 and an anode 110, a width of which boundary region is preferably from 0.4 μm to 1.3 μm. The width of the boundary region 120 defines a maximum current intensity between the cathode 130 and the anode 110.

I claim:

1. A semiconductor diode, comprising:
   two electrodes forming a cathode and an anode, at least one of said electrodes being a curved electrode having an inner edge length and another of said electrodes being an inner electrode having a width and a surface area of at most 20% of a product of said width of said inner electrode and said inner edge length of said curved electrode, said curved electrode having a surface area and said surface area of said inner electrode amounts to at most 20% of said surface area of said curved electrode, and said surface area of said inner electrode is at most 15 μm².

2. The semiconductor diode according to claim 1, wherein said surface area of said inner electrode amounts to at most 15% of the product of said width of said inner electrode and said inner edge length of said curved electrode.

3. The semiconductor diode according to claim 1, wherein said surface area of said inner electrode amounts to at most 15% of said surface area of said curved electrode.

4. The semiconductor diode according to claim 1, wherein said curved electrode is curved such that said inner electrode is at least partially surrounded by said curved electrode.

5. The semiconductor diode according claim 1, wherein said curved electrode exhibits centrosymmetry.

6. The semiconductor diode according to claim 5, wherein said curved electrode, at least in segments, has a form of an arc of a circle.

7. The semiconductor diode according to claim 6, wherein said curved electrode has an annular form.

8. The semiconductor diode according to claim 1, wherein said inner electrode has a circular form.

9. The semiconductor diode according to claim 1, wherein said inner electrode has a form of a polygon.

10. The semiconductor diode according to claim 1, wherein said inner electrode is disposed at a midpoint of said curved electrode.

11. An electrical circuit, comprising:
    a semiconductor diode, including:
       two electrodes forming a cathode and an anode, at least one of said electrodes being a curved electrode having an inner edge length and another of said electrodes being an inner electrode having a width and a surface area of at most 20% of a product of said width of said inner electrode and said inner edge length of said curved electrode, said curved electrode having a surface area and said surface area of said inner electrode amounts to at most 20% of said surface area of said curved electrode, and said surface area of said inner electrode is at most 15 μm².

* * * * *

UNITED STATES PATENT AND TRADEMARK OFFICE
CERTIFICATE OF CORRECTION

PATENT NO.    : 6,339,249 B1
DATED         : January 15, 2002
INVENTOR(S)   : Wolfgang Keller It is certified that error appears in the above-identified patent and that said Letters Patent is hereby corrected as shown below:

<u>Title page,</u>
Item [30], insert -- [30]     Foreign Application Priority Data
                Oct. 22, 1997   [DE]   Germany        197 46 620.6 --

Signed and Sealed this

Eighth Day of October, 2002

Attest:

JAMES E. ROGAN
Attesting Officer     *Director of the United States Patent and Trademark Office*